United States Patent
Liu et al.

(10) Patent No.: US 9,837,725 B2
(45) Date of Patent: Dec. 5, 2017

(54) WIDE-FREQUENCY WAVE-ABSORBING METAMATERIAL, ELECTRONIC DEVICE AND METHOD FOR OBTAINING WIDE-FREQUENCY WAVE-ABSORBING METAMATERIAL

(71) Applicant: KUANG-CHI INNOVATIVE TECHNOLOGY LTD., Shenzhen (CN)

(72) Inventors: Ruopeng Liu, Shenzhen (CN); Zhiya Zhao, Shenzhen (CN); Chaofeng Kou, Shenzhen (CN); Jiawei He, Shenzhen (CN); Jincai Ye, Shenzhen (CN)

(73) Assignee: KUANG-CHI INNOVATIVE TECHNOLOGY LTD., Shenzhen (CN)

( * ) Notice: Subject to any disclaimer, the term of this patent is extended or adjusted under 35 U.S.C. 154(b) by 430 days.

(21) Appl. No.: 14/602,206

(22) Filed: Jan. 21, 2015

(65) Prior Publication Data

US 2015/0138009 A1     May 21, 2015

Related U.S. Application Data

(63) Continuation of application No. PCT/CN2013/080523, filed on Jul. 31, 2013.

(30) Foreign Application Priority Data

Jul. 31, 2012 (CN) .......................... 2012 1 0268267
Aug. 3, 2012 (CN) .......................... 2012 1 0275244
Aug. 3, 2012 (CN) .......................... 2012 1 0275382

(51) Int. Cl.
*H01Q 17/00*     (2006.01)
*H01Q 15/00*     (2006.01)
(Continued)

(52) U.S. Cl.
CPC .......... *H01Q 17/00* (2013.01); *H01Q 15/0086* (2013.01); *H01Q 17/008* (2013.01); *H05K 9/0088* (2013.01); *Y10T 29/49016* (2015.01)

(58) Field of Classification Search
CPC ........... H01Q 15/0006; H01Q 15/0086; H01Q 17/00; H01Q 17/007; H01Q 17/008;
(Continued)

(56) References Cited

U.S. PATENT DOCUMENTS 5,095,311 A * 3/1992 Sajiki et al. ........... H01Q 17/00
5,214,432 A * 5/1993 Kasevich et al. ...... H01Q 17/00
(Continued)

FOREIGN PATENT DOCUMENTS

CN    200986957 Y    12/2007
CN    101840735 A    9/2010
(Continued)

OTHER PUBLICATIONS

J. B. Pendry et al., "Magnetism from Conductors and Enhanced Nonlinear Phenomena"; IEEE Tranasactions on Microwave Theory and Techniques; vol. 47, No. 11; Nov. 1999; pp. 2075-2084.*
(Continued)

*Primary Examiner* — Bernarr E Gregory
(74) *Attorney, Agent, or Firm* — Perkins Coie LLP

(57) ABSTRACT

The disclosure discloses a wide-frequency wave-absorbing metamaterial, which comprises a plurality of layers of substrates and microstructures respectively arranged on the substrates at different layers. The wave-absorbing frequency band of the wide-frequency wave-absorbing metamaterial is relatively wide. The disclosure further discloses an electronic device and a method for obtaining a wide-frequency wave-absorbing metamaterial. By using the foregoing manner, the disclosure can enable a wave-absorbing metamaterial to significantly increase a wave-absorbing bandwidth
(Continued)

based on a relatively good electromagnetic wave absorbing effect.

18 Claims, 11 Drawing Sheets

(51) Int. Cl.
*H05K 9/00* (2006.01)
*G01S 13/00* (2006.01)

(58) Field of Classification Search
CPC ......... H01Q 15/0013; H01Q 15/0026; H05K 9/0071; H05K 9/0081; H05K 9/0088; H05K 9/0007; H05K 9/0009; H05K 9/0018; H05K 9/002; H05K 9/0022; G02B 1/002; G02B 1/007; Y10T 29/49; Y10T 29/49002; Y10T 29/49016
See application file for complete search history.

(56) References Cited

U.S. PATENT DOCUMENTS

| | | | | |
|---|---|---|---|---|
| 8,179,298 | B2* | 5/2012 | Sim | H01Q 17/00 333/81 R |
| 8,197,887 | B1* | 6/2012 | Burckel | G02B 1/007 427/100 |
| 9,322,953 | B2* | 4/2016 | Narimanov | G02B 1/002 |
| 2001/0038325 | A1* | 11/2001 | Smith | H01Q 15/0086 333/202 |
| 2005/0247471 | A1* | 11/2005 | Archambeault | H05K 9/0081 174/388 |
| 2009/0160718 | A1* | 6/2009 | Yen | H01Q 15/0086 343/742 |
| 2010/0053019 | A1* | 3/2010 | Ikawa | H01Q 15/0026 343/866 |
| 2010/0314040 | A1* | 12/2010 | Tyler, II | G02B 1/007 156/278 |
| 2011/0287218 | A1* | 11/2011 | Narimanov | G02B 1/002 428/141 |
| 2012/0182202 | A1* | 7/2012 | Yamada | H01Q 15/0086 343/909 |

FOREIGN PATENT DOCUMENTS

| | | |
|---|---|---|
| CN | 102480000 A | 5/2012 |
| CN | 102480024 A | 5/2012 |
| CN | 102480031 A | 5/2012 |
| CN | 102480034 A | 5/2012 |
| CN | 102800991 A | 11/2012 |
| CN | 102811595 A | 12/2012 |
| DE | 1591244 A1 | 10/1970 |
| EP | 0369174 A1 | 5/1990 |
| JP | H04122098 A | 4/1992 |
| JP | H0537175 A | 2/1993 |
| JP | H0974297 A | 3/1997 |
| JP | 2002057486 A | 2/2002 |
| JP | 2004134570 A | 4/2004 |
| JP | 2004193460 A | 7/2004 |
| JP | 2006049354 A | 2/2006 |
| KR | 20010093434 A | 10/2001 |
| WO | 2013014406 A2 | 1/2013 |

OTHER PUBLICATIONS

D. R. Smith et al., "Composite Medium with Simultaneously Negative Permeability and Permittivity"; Physical Review Letters; vol. 84, No. 18; May 1, 2000; pp. 4184-4187.*
Yildirim et al: " Development of multi-layered circuit analog radar absorbing structures", A Thesis Submitted to the Graduate School of Natural and Applied Sciences of Middle East Technical University in Partial Fulfillment of the Requirements for the Degree of Master of Science in Electrical and Electronics Engineering, Middle East Techni, May 1, 2012 (May 1, 2012), pp. 1-178, XP008176518, pp. 116-118—pp. 134-137.
Sipal VIT, European Patent Office, EP 13824829, Supplementary European Search Report, dated Feb. 1, 2016.

* cited by examiner

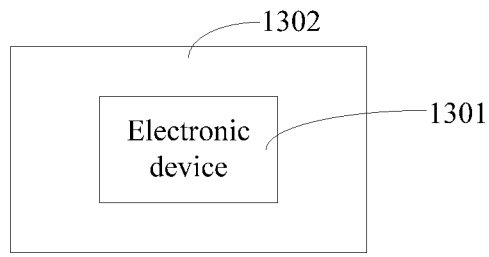

FIG. 18

| At least two basic unit layers are provided. Each basic unit layer includes a substrate and a plurality of microstructures periodically arranged on the substrate. The basic unit layers respectively absorb a predetermined frequency or a predetermined frequency band of an electromagnetic wave. The microstructures at the same basic unit layer are the same in topology shape and size, and microstructures at different basic unit layers are different in topology shape and/or size. | S101 |

↓

| At least two different metamaterial microstructure layers are stacked to form a metamaterial. | S102 |

FIG. 19

WIDE-FREQUENCY WAVE-ABSORBING METAMATERIAL, ELECTRONIC DEVICE AND METHOD FOR OBTAINING WIDE-FREQUENCY WAVE-ABSORBING METAMATERIAL

CROSS REFERENCE TO RELATED APPLICATIONS

This application is a continuation of PCT/CN2013/080523 filed 2013 Jul. 31, which claims priority to CN 201210268267.X filed 2012 Jul. 31, CN 201210275382.X filed 2012 Aug. 3, and CN 201210275244.1 filed 2012 Aug. 3, all of which are incorporated herein by reference.

TECHNICAL FIELD

The disclosure relates to a wave-absorbing material, and in particular, to a wide-frequency wave-absorbing metamaterial, an electronic device, and a method for obtaining a wide-frequency wave-absorbing material.

BACKGROUND

With fast-changing technology and science development, the number of technologies and products that use an electromagnetic wave as a medium is increasing, and radiation of an electromagnetic wave also has an increasingly large impact on the environment. For example, a radio wave may interfere with an airport environment, causing that an airplane cannot normally take off; a mobile telephone may interfere with various precision electronic medical apparatuses; even a common computer also radiates an electromagnetic wave carrying information, where the electromagnetic wave may be received and reproduced several kilometers away, causing a leakage of intelligence such as national defense, politics, economy, and technology. Therefore, it has become a major task of material science to regulate electromagnetic pollution and find a material, namely a wave-absorbing material, that can withstand and weaken electromagnetic wave radiation.

A wave-absorbing material is a material that can absorb electromagnetic wave energy projected on the surface of the material. The wave-absorbing material is widely applied in military and other aspects, for example, a stealth aircraft and an invisible clothes. Basic conditions of absorbing an electromagnetic wave by a material is as follows: (1) When an electromagnetic wave is incident to the material, the electromagnetic wave can enter into the material to the greatest extent, that is, the material is required to have a matching characteristic; (2) Almost all the electromagnetic wave entering into the material can quickly be attenuated, that is, an attenuation characteristic. One method for implementing the first condition is to use a special boundary condition. For example, a medium whose conductivity and magnetic permeance is close to the conductivity and magnetic permeance of air is coated on a surface of a high-conductivity and high-magnetic permeance wave-absorbing material, so that an electromagnetic wave can be incident to the greatest extent. A material is required to have a high electromagnetic loss property so as to implement the second condition.

In an existing wave-absorbing material, absorbing performance of each material for an electromagnetic wave is used, and a component of different materials is designed so that a mixed material has a wave-absorbing characteristic. This kind of material is of a complex design and cannot be promoted in a large scale. In addition, a mechanical property of this kind of material is restricted by a mechanical property of the material itself, and a requirement in a special occasion cannot be met. In addition, the existing wave-absorbing metamaterial has made great progress in an absorbing effect for an electromagnetic wave at a specified frequency, but generally a frequency band that the wave-absorbing metamaterial absorbs is extremely narrow.

SUMMARY

A technical problem to be resolved in the disclosure is to provide, aiming at disadvantages in the prior art, a wide-frequency wave-absorbing metamaterial that has a relatively wide wave-absorbing frequency band, where the wide-frequency wave-absorbing metamaterial includes a plurality of layers of substrates and microstructures separately arranged on the substrates at different layers. Further, topology shapes and/or sizes of the microstructures at different layers in the wide-frequency wave-absorbing metamaterial are different.

Details are as follows:

A technical problem to be resolved in the disclosure is to provide, aiming at disadvantages in the prior art, a wide-frequency wave-absorbing metamaterial designed by using a metamaterial theory. The wide-frequency wave-absorbing metamaterial has a wide absorbing frequency band and optimal wave-absorbing performance and has a wide application prospect.

Another technical problem to be mainly resolved in the disclosure is to provide a wide-frequency wave-absorbing metamaterial, an electronic device, and a method for obtaining a wide-frequency wave-absorbing metamaterial, so as to enable the wave-absorbing metamaterial to significantly increase a wave-absorbing bandwidth based on a relatively good electromagnetic wave absorbing effect.

Still another technical problem to be resolved in the disclosure is to provide, aiming at the foregoing disadvantages in the prior art, a wide-frequency wave-absorbing material that has a relatively wide wave-absorbing frequency band, a relatively thin thickness, and good wave-absorbing performance.

A technical solution used to resolve the foregoing technical problem is to propose a wide-frequency wave-absorbing metamaterial, where the wide-frequency wave-absorbing metamaterial is imaginarily divided into a plurality of basic units, the basic unit includes a plurality of layers of subunits, the subunit includes a substrate and microstructures attached to the substrate, topology shapes of the microstructures on subunits at the layers are the same, and sizes of the microstructures of the subunits at the layers gradually increase along an electromagnetic wave transmission direction.

Further, the microstructure of the subunit at each layer includes one or more first basic microstructures and one or more second basic microstructures, where the first basic microstructure is a complete circular ring-shaped microstructure, the second basic microstructure is a circular ring-shaped microstructure with four same, evenly spaced gaps defined along the circumference thereof, and the one or more first basic microstructures and the one or more second basic microstructures are concentrically arranged.

Further, the microstructure of the subunit at each layer includes one first basic microstructure shape and one second basic microstructure shape, and a radius of the first basic microstructure shape is less than a radius of the second basic microstructure shape.

Further, the microstructure of the subunit at each layer includes two first basic microstructures whose radii are r1 and r2 and one second basic microstructure, a radius of the second basic microstructure is greater than r2, and r2 is greater than r1.

Further, the microstructure of the subunit at each layer includes one first basic microstructure and two second basic microstructures whose radii are r1' and r2', r2' is greater than r1', and r1' is greater than a radius of the first basic microstructure.

Further, the basic unit includes nine layers of the subunits, the sizes of the microstructures of the subunit at the nine layers increase in a linear and equal proportion manner along a wave propagation direction, and a proportional number is 0.3-1.5.

Further, the substrate is made of an FR4 material.

In the disclosure, a wave-absorbing metamaterial is designed by using a metamaterial theory; and a plurality of layers of subunits are set and sizes of microstructures on a subunit at each layer gradually change, so that an effect of impedance matching and wide-frequency wave-absorbing is implemented. In the disclosure, an attenuation degree of the wide-frequency wave-absorbing metamaterial to an electromagnetic wave reaches 5 dB to 14 dB at an interval between 4.2 GHZ to 20 GHZ, so that the wide-frequency wave-absorbing metamaterial has a wide wave-absorbing frequency band and a good wave-absorbing effect.

To resolve another technical problem in the foregoing, a technical solution used in the disclosure is as follows: A wide-frequency wave-absorbing metamaterial is provided, where the metamaterial includes at least two basic unit layers, each basic unit layer includes a substrate and a plurality of microstructures periodically arranged on the substrate, each basic unit layer is respectively corresponding to a predetermined frequency or a predetermined frequency band that absorbs an electromagnetic wave, the plurality of microstructures at each basic unit layer are the same in topology shape and size, and microstructures at different basic unit layers are different in topology shape and/or size.

Shapes of microstructures at the basic unit layer are circular rings.

The at least two basic unit layers of the metamaterial are stacked in an outer layer-to-inner layer manner according to sizes of microstructures at the basic unit layers.

The at least two basic unit layers of the metamaterial are stacked along the outer layer-to-inner layer direction with the sizes of the microstructures at the corresponding basic unit layers ascending.

The metamaterial includes four basic unit layers, a first basic unit layer includes a first substrate and a plurality of first microstructures periodically arranged on the first substrate, and the first microstructure is a circular microstructure; a second basic unit layer includes a second substrate and a plurality of second microstructures periodically arranged on the second substrate, and the second microstructure includes a first circular microstructure and a second circular microstructure, of which a radius is greater than a radius of the first circular microstructure, that is concentrically arranged with the first circular microstructure; a third basic unit layer includes a third substrate and a plurality of third microstructures periodically arranged on the third substrate, the third microstructure includes a third circular microstructure, a fourth circular microstructure, and a fifth circular microstructure, and the third circular microstructure, the fourth circular microstructure, and the fifth circular microstructure increase in radius successively and are concentrically arranged with an equal spacing; a fourth basic unit layer includes a fourth substrate and a plurality of fourth microstructures periodically arranged on the fourth substrate, the fourth microstructure includes a sixth circular microstructure, a seventh circular microstructure, an eighth circular microstructure, and a ninth circular microstructure, and the sixth circular microstructure, the seventh circular microstructure, the eighth circular microstructure, and the ninth circular microstructure increase in radius successively and are concentrically arranged with an equal spacing.

At the second basic unit layer, a spacing between the second circular microstructure and the first circular microstructure is a first spacing; at the third basic unit layer, both a spacing between the third circular microstructure and the fourth circular microstructure and a spacing between the fourth circular microstructure and the fifth circular microstructure are the first spacing; at the fourth basic unit layer, a spacing between the sixth circular microstructure and the seventh circular microstructure, a spacing between the seventh circular microstructure and the eighth circular microstructure, and a spacing between the eighth circular microstructure and the ninth circular microstructure are the first spacing.

The first to the ninth circular microstructures are metal microstructures.

The first substrate, the second substrate, the third substrate, and the fourth substrate are the same in substrate material and are an FR-4 material, an F4B material, a polystyrene PS material, a ferroelectrics material, a ferrite material, or a ferromagnetic material.

To resolve the foregoing technical problem, another technical solution used in the disclosure is as follows: An electronic device is provided, where the electronic device includes a casing, the casing is provided with a wide-frequency wave-absorbing metamaterial, the metamaterial includes at least two basic unit layers, each basic unit layer includes a substrate and a plurality of microstructures periodically arranged on the substrate, each basic unit layer is respectively corresponding to a predetermined frequency or a predetermined frequency band that absorbs an electromagnetic wave, the plurality of microstructures at each basic unit layer are the same in topology shape and size, and microstructures at different basic unit layers are different in topology shape and/or size.

To resolve the foregoing technical problem, still another technical solution used in the disclosure is as follows: A method for obtaining a wide-frequency wave-absorbing metamaterial is provided, where the method includes: providing at least two basic unit layers, where each basic unit layer includes a substrate and a plurality of microstructures periodically arranged on the substrate, each basic unit layer is respectively corresponding to a predetermined frequency or a predetermined frequency band that absorbs an electromagnetic wave, the plurality of microstructures at each basic unit layer are the same in topology shape and size, and microstructures at different basic unit layers are different in topology shape and/or size; and stacking the at least two basic unit layers to form a metamaterial.

A beneficial effect of the disclosure is as follows: Different from a situation in the prior art, at least two basic unit layers in the disclosure are separately corresponding to a predetermined frequency or a predetermined frequency band that absorbs an electromagnetic wave, the plurality of microstructures at each basic unit layer are the same in topology shape and size, and microstructures at different basic unit layers are different in topology shape and/or size. The wave-absorbing metamaterial including a plurality of microstructure layers can significantly increase a wave-absorbing bandwidth based on a relatively good electromagnetic wave absorbing effect.

To resolve yet another technical problem in the foregoing, a technical solution used in the disclosure is as follows: A wide-frequency wave-absorbing material is proposed, where the wide-frequency wave-absorbing material is imaginarily divided into a plurality of basic units, each basic unit includes a plurality of sheet layers stacked along an electromagnetic wave transmission direction, each sheet layer includes a substrate and microstructures coated on a surface of the substrate, the microstructure is a metal coating, sizes of the sheet layers gradually increase along the electromagnetic wave transmission direction, and central axes of the sheet layers coincide with each other.

Further, along the electromagnetic wave transmission direction, the basic unit is divided into three parts, where substrates at sheet layers of a first part have a first permittivity, substrates at sheet layers of a second part have a second permittivity, and substrates at sheet layers of a third part have a third permittivity; and the first permittivity is less than the second permittivity and less than the third permittivity.

Further, along the electromagnetic wave transmission direction, sizes of the sheet layers gradually increase in an equal difference manner.

Further, the first part of the basic unit includes four sheet layers, and the first permittivity of a substrate at each sheet layer is 2.6 to 2.8; the second part of the basic unit includes thirteen sheet layers, and the second permittivity of a substrate at each sheet layer is 3.5 to 4.0; and the third part of the basic unit includes three sheet layers, and the third permittivity of a substrate at each sheet layer is 8.5 to 9.0.

Further, a thickness of each sheet layer is 0.2 mm, and a thickness of a metal coating is 0.01 to 0.02 mm.

Further, substrates at sheet layers of the first part of the basic unit are an FR4 material, an F4B material, or a PS material.

Further, substrates at sheet layers of the second part of the basic unit are an FR4 material, an F4B material, or a PS material.

Further, substrates at sheet layers of the third part of the basic unit are an FR4 material, an F4B material, or a PS material.

Further, a material of the metal coating is copper, silver or aluminum.

Further, a surface of each sheet layer with a metal coating is a square, a side length of the largest square surface is 10.4 mm, and a side length of the smallest square surface is 5 mm.

In the disclosure, a pyramidal basic unit is designed, and exemplarily substrates at different parts of the pyramidal basic unit have different permittivities, so that an effect of impedance matching and wide-frequency wave-absorbing is implemented. An attenuation degree of a wide-frequency wave-absorbing material in the disclosure reaches more than 10 dB in a bandwidth between 7.5 GHZ to 12 GHZ.

BRIEF DESCRIPTION OF DRAWINGS

The accompanying drawings described herein are provided to help further understand the disclosure, and constitute a part of this application, and exemplary embodiments and descriptions of the disclosure are used for explaining the disclosure, but do not constitute a limitation on the disclosure. In the drawings:

FIG. 18 is a schematic structural view of an electronic device in the second embodiment group of a wide-frequency wave-absorbing metamaterial in the disclosure;

FIG. 19 is a flowchart of an embodiment of a method for obtaining a wide-frequency wave-absorbing metamaterial in the second embodiment group of a wide-frequency wave-absorbing metamaterial in the disclosure;

DESCRIPTION OF EMBODIMENTS

It should be noted that the embodiments of the present application and features in the embodiments may be mutually combined in a case in which they do not conflict with each other. The following describes embodiments of the disclosure with reference to the accompanying drawings.

When light, which is an electromagnetic wave, traverses glass, because a wavelength of the light is far greater than a size of an atom, an overall parameter of the glass, such as a refractive index, but not a detailed parameter of an atom forming the glass is used to describe a response of the glass to the light. Correspondingly, when it is studying a response of a material to another electromagnetic wave, responses of any structures of the material with a dimension far smaller than a structure of a wavelength of the electromagnetic wave to an electromagnetic wave may also be described by an overall parameter of the material, such as a permittivity $\epsilon$ and a magnetic conductivity $\mu$. By designing structures of all points of the material, all points of the material are the same or different in permittivity and magnetic conductivity, so that overall permittivities and magnetic conductivities of the material are arranged in a regular manner. The regularly arranged permittivities and magnetic conductivities can enable the material to have a macro response to the electromagnetic wave, for example, converging electromagnetic waves, diverging electromagnetic waves, and absorbing electromagnetic waves. The material having such regularly arranged permittivities and magnetic conductivities is referred to as a metamaterial.

Figure 1:
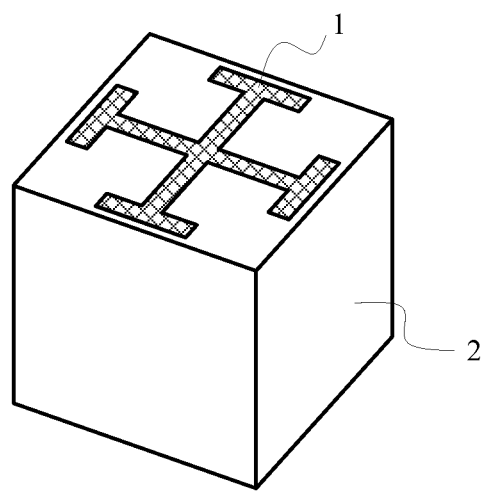
FIG. 1 is a schematic three-dimensional structural view of a basic unit of a metamaterial.

As shown in FIG. 1, FIG. 1 is a schematic three-dimensional structural view of a basic unit of a metamaterial. The basic unit of the metamaterial includes an artificial microstructure 1 and a substrate 2 to which the artificial microstructure is attached. The artificial microstructure may be an artificial metal microstructure and has a planar or three-dimensional topology structure that generates a response to an electric field and/or a magnetic field of an incident electromagnetic wave. A response of each basic unit of the metamaterial to the incident electromagnetic wave can be changed by changing a pattern and/or a size of an artificial metal microstructure on each basic unit of the metamaterial. Arranging a plurality of basic units of the metamaterial in a regular manner can enable the metamaterial to have a macro response to the electromagnetic wave. Because the metamaterial needs to have a macro electromagnetic response to the incident electromagnetic wave in overall, responses of all basic units of the metamaterial to the incident electromagnetic wave need to form continuous responses. This requires that a size of each basic unit of the metamaterial is less than one fifth of a wavelength of the incident electromagnetic wave, exemplarily one tenth of the wavelength of the incident electromagnetic wave. In the descriptions in this paragraph, the metamaterial is divided into a plurality of basic units of the overall metamaterial is an imaginary division method. It should be noted that the division method is merely for convenience of description. The metamaterial can be formed by jointing or assembling a plurality of basic units of the metamaterial, or by periodically arranging artificial metal microstructures on a substrate. In an actual application, it should not be considered that the metamaterial is formed by jointing or assembling a plurality of basic units of the metamaterial. The metamaterial can be formed by periodically arranging the artificial metal microstructures on a substrate, which is of simple production technologies and low costs. Periodical arranging means that the artificial metal microstructures on all basic units of the metamaterial that are obtained by artificial division can generate continuous electromagnetic responses to the incident electromagnetic wave.

First Embodiment Group

The first embodiment group of the disclosure is described with reference to FIG. 2 to FIG. 8 in detail.

In the first embodiment group of the disclosure, a wide-frequency wave-absorbing metamaterial is designed by using the foregoing metamaterial theory. A difference from FIG. 1 is that in the first embodiment group of the disclosure, a basic unit of a wave-absorbing metamaterial includes a plurality of layers of subunits. Each layer of subunit includes different microstructures attached from other layers. An effect of impedance matching and wide-frequency wave-absorbing is implemented by designing different arrangements of microstructures. In the first embodiment group of the disclosure, microstructures of subunits have a same topology shape but different sizes, and sizes of the microstructures of subunits gradually increase along a wave propagation direction. It can be learned from experiments that under a condition of a same substrate, a subunit with a larger microstructure has a higher refractive index. Because sizes of microstructures of the layers of subunit gradually change in the first embodiment group of the disclosure, when there is an incident electromagnetic wave, a gain loss due to reflection, caused by a sudden change of the refractive index, of the electromagnetic wave can be reduced, thereby implementing an effect of impedance matching. In addition, the microstructures of the layers of subunit have wave-absorbing effects, and the wave-absorbing effects of the layers of subunit are superposed to implement wide-frequency and high-efficiency wave-absorbing performance.

Figure 2:
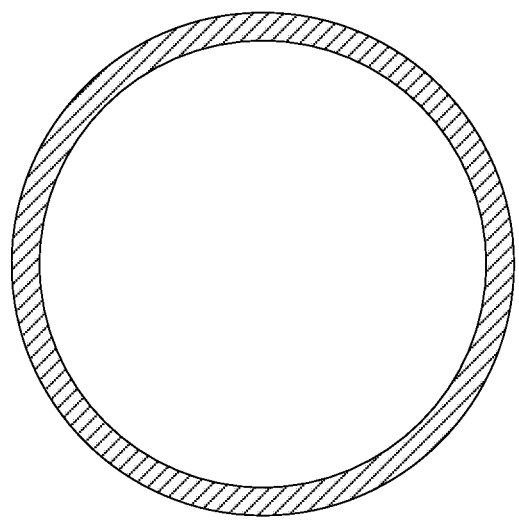
FIG. 2 is a schematic view of a first basic structure forming a topology structure of a subunit at each layer in the first embodiment group of a wide-frequency wave-absorbing metamaterial in the disclosure.
Figure 3:
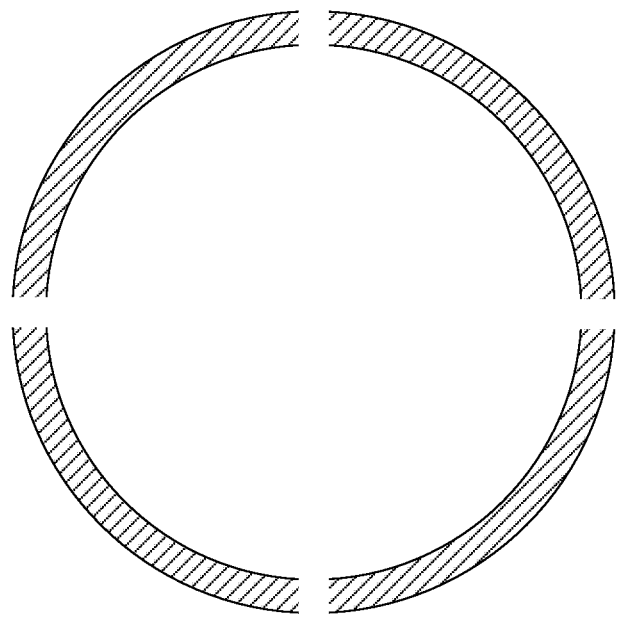
FIG. 3 is a schematic view of a second basic structure forming a topology structure of a subunit at each layer in the first embodiment group of a wide-frequency wave-absorbing metamaterial in the disclosure.
Figure 4:
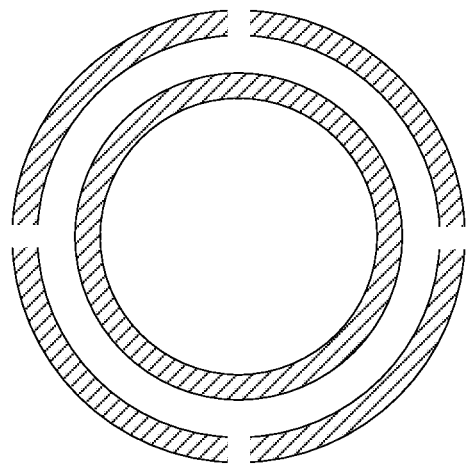
FIG. 4 is a schematic view of a first exemplary embodiment of a topology structure of a microstructure attached to a subunit at each layer in the first embodiment group of a wide-frequency wave-absorbing metamaterial in the disclosure.

Topology structures of the microstructures of the layers of subunit may be formed by combining basic structures shown in FIG. 2 and FIG. 3. A topology shape of a first basic microstructure shown in FIG. 2 is a complete circular ring-shaped microstructure. A topology shape of a second basic microstructure shown in FIG. 3 is a circular ring-shaped microstructure with four same, evenly spaced gaps defined along the circumference thereof. Topology structures of the layers of subunit may be formed by the foregoing two basic microstructures with a same number or different numbers. For example, as shown in FIG. 4, topology structures of a subunit at each layer include one first basic microstructure and one second basic microstructure, the first basic microstructure and the second basic microstructure are concentrically arranged, and a radius of the second basic microstructure is greater than a radius of the first basic microstructure.

Figure 5:
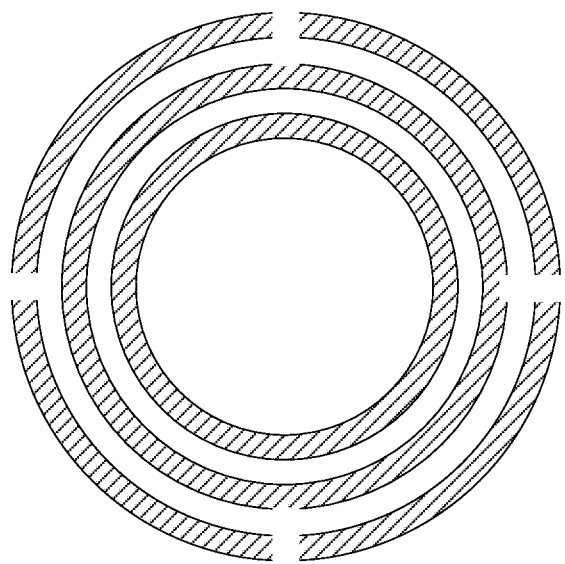
FIG. 5 is a schematic view of a second exemplary embodiment of a topology structure of a microstructure attached to a subunit at each layer in the first embodiment group of a wide-frequency wave-absorbing metamaterial in the disclosure.

As shown in FIG. 5, topology structures of a subunit at each layer include two first basic microstructures whose radii are respectively r1 and r2 and one second basic microstructure, the two first basic microstructures and the second basic microstructure are concentrically arranged, a radius of the second basic microstructure is greater than r2, and r2 is greater than r1.

Figure 6:
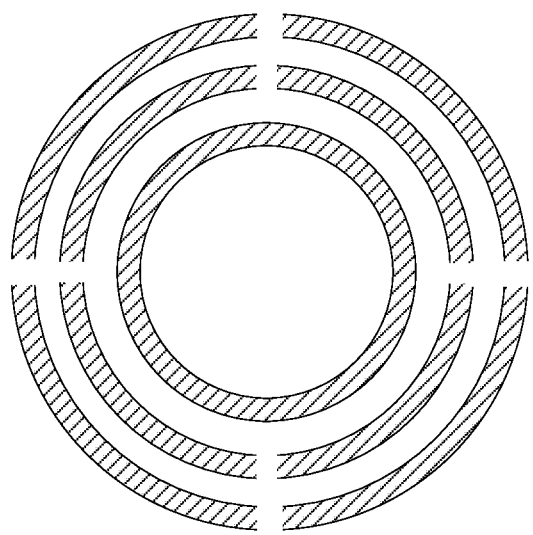
FIG. 6 is a schematic view of a third exemplary embodiment of a topology structure of a microstructure attached to a subunit at each layer in the first embodiment group of a wide-frequency wave-absorbing metamaterial in the disclosure.

As shown in FIG. 6, topology structures of a subunit at each layer include one first basic microstructure and two second basic microstructures whose radii are respectively r1' and r2', the first basic microstructure and the two second basic microstructures are concentrically arranged, r2' is greater than r1', and r1' is greater than a radius of the first basic microstructure.

With reference to the foregoing descriptions, many other different types of combination manners may still exist, and details are not described herein.

Figure 7:
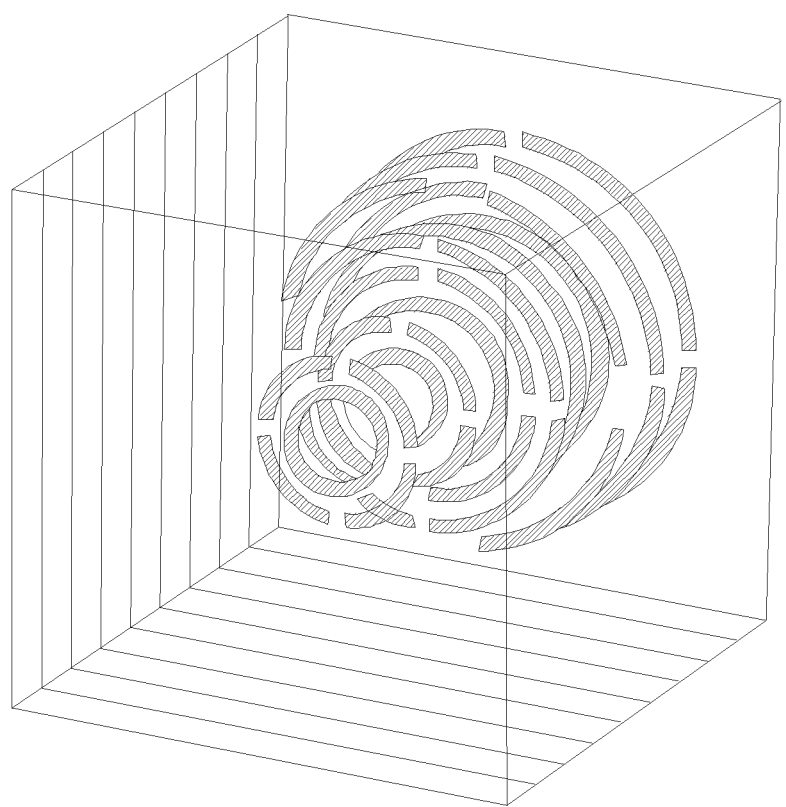
FIG. 7 is a schematic three-dimensional structural view of an exemplary embodiment of a basic unit in the first embodiment group of a wide-frequency wave-absorbing metamaterial in the disclosure.

As shown in FIG. 7, a schematic structural view of an exemplary embodiment of a basic unit of a wide-frequency wave-absorbing material in the first embodiment group of the disclosure is shown. In FIG. 7, the basic unit of the wide-frequency wave-absorbing metamaterial includes nine layers of the subunits. A subunit at each layer includes a substrate and microstructures attached to the substrate. All substrates are the same in material and are an FR4 material in this embodiment. Topology shapes of microstructures on all substrates are the same and are the topology shape shown in FIG. 4. Along a wave propagation direction, sizes of the microstructures on all substrates gradually increase. A size increasing rule may be linear increasing with an equal proportion or may be exponential increasing. In this embodiment, linear increasing with an equal proportion is used, and a proportional number is 0.3 to 1.5.

Figure 8:
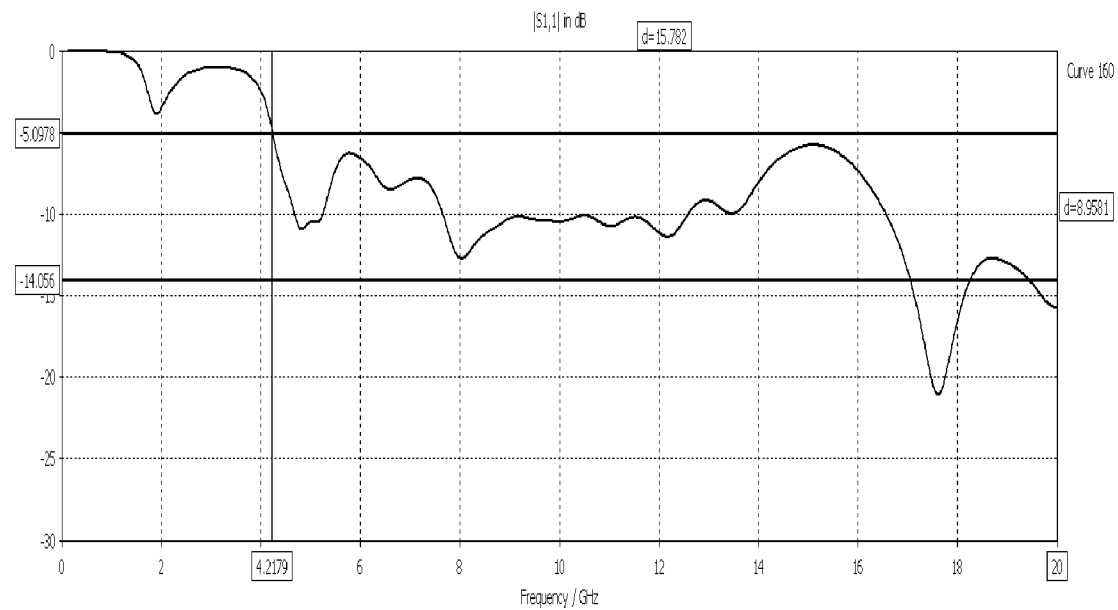
FIG. 8 is a diagram of a simulation result of a wide-frequency wave-absorbing metamaterial formed by the basic units shown in FIG. 7 in the first embodiment group of a wide-frequency wave-absorbing metamaterial in the disclosure.

FIG. 8 is a diagram of a simulation effect of an S11 parameter, where the diagram is obtained by the wide-frequency wave-absorbing material shown in FIG. 7 using CST (Computer Simulation Technology) software. It can be seen from FIG. 8 that the wide-frequency wave-absorbing metamaterial in this embodiment has a wide wave-absorbing frequency band and good wave-absorbing performance. Between 4.2 GHZ and 20 GHZ, a good wave-absorbing effect exists, and an electromagnetic wave attenuation degree is 5 dB to 14 dB.

Second Embodiment Group

With reference to FIG. 9 to FIG. 19 in detail, the second embodiment group of the disclosure is described in the following, where a wide-frequency wave-absorbing metamaterial is referred to as a metamaterial for short in the second embodiment group.

Figure 9:
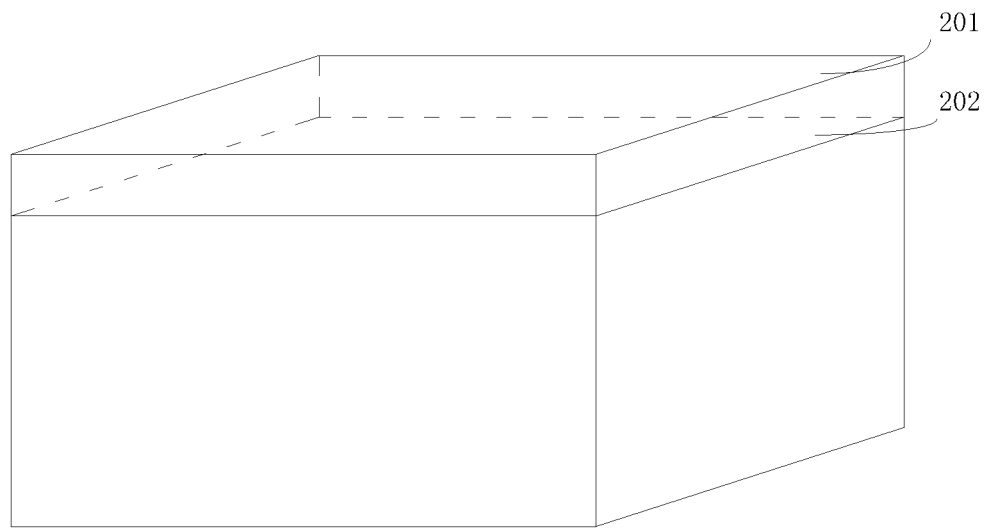
FIG. 9 is a schematic structural view of a basic unit forming a wide-frequency wave-absorbing metamaterial in an embodiment in the second embodiment group of a wide-frequency wave-absorbing metamaterial in the disclosure.
Figure 10:
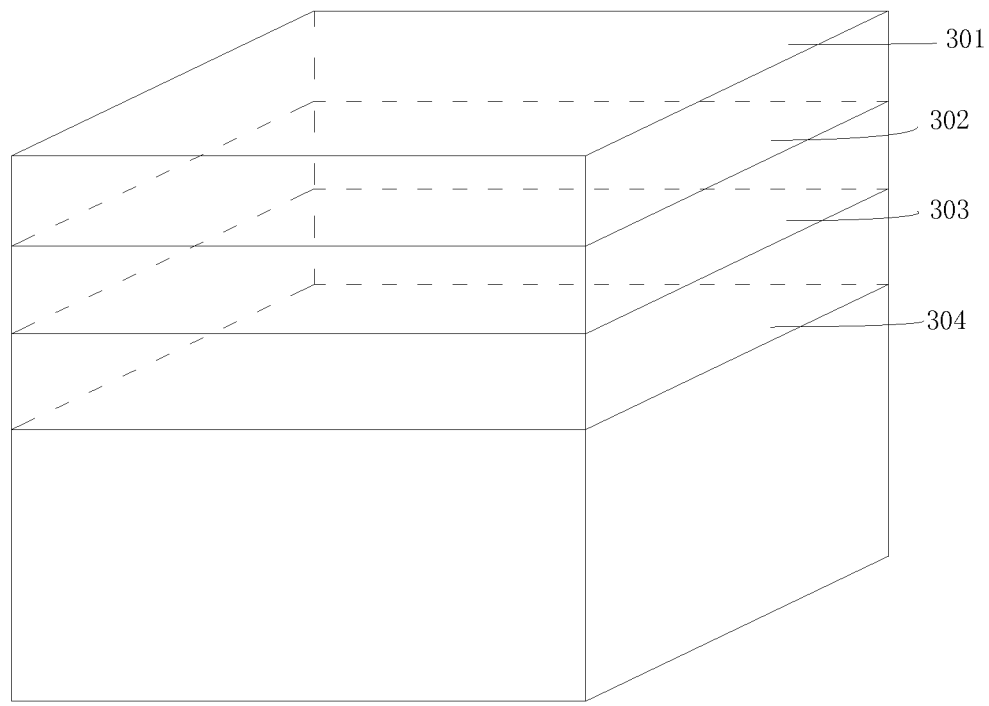
FIG. 10 is a schematic structural view of a basic unit forming a wide-frequency wave-absorbing metamaterial in another embodiment in the second embodiment group of a wide-frequency wave-absorbing metamaterial in the disclosure.

FIG. 9 is a schematic structural view of a basic unit forming a wide-frequency wave-absorbing metamaterial in an embodiment in the second embodiment group of a wide-frequency wave-absorbing metamaterial in the disclosure. FIG. 10 is a schematic structural view of a basic unit forming a wide-frequency wave-absorbing metamaterial in another embodiment in the second embodiment group of a wide-frequency wave-absorbing metamaterial in the disclosure. According to an actual situation, a metamaterial includes two basic unit layers, three basic unit layers, . . . , or N basic unit layers, and includes at least two basic unit layers. As shown in FIG. 9, the metamaterial includes two basic unit layers, 201 and 202. As shown in FIG. 10, the metamaterial includes four basic unit layers, 301, 302, 303, and 304. Each basic unit layer of the metamaterial includes a substrate and a plurality of microstructures periodically arranged on the substrate. Topology shapes and sizes of the microstructures at the same basic unit layer of the metamaterial are the same, and topology shapes and/or sizes of the microstructures at different layers are different. An FR-4 material, an F4B material, a PS material, a ferroelectrics material, a ferrite materials, or a ferromagnetic material may be selected as a material of the substrate of each basic unit layer of the metamaterial. Exemplarily, a material that causes a relatively high loss to an electromagnetic wave is selected as the material of the substrate at each basic unit layer of the metamaterial, so as to strengthen a wave-absorbing effect of the wide-frequency wave-absorbing metamaterial in the second embodiment group of the disclosure. Microstructures of different basic unit layers of the metamaterial are different, and the basic unit layers of the metamaterial respectively absorbs a predetermined frequency or a predetermined frequency band of an electromagnetic wave.

The microstructures of different basic unit layers are different, so that functions of microstructures at the basic unit layers are also different from each other. In addition, microstructures between layers affect each other. Therefore, a wide-frequency wave-absorbing effect is achieved by synthesizing effects of the basic unit layers.

Figure 11:
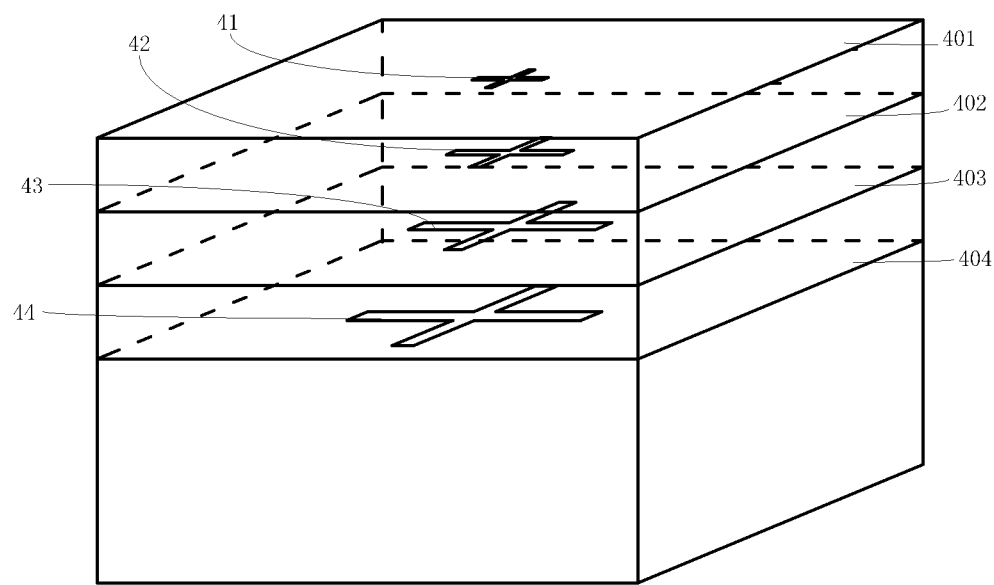
FIG. 11 is a schematic structural view of a basic unit forming a wide-frequency wave-absorbing metamaterial in still another embodiment in the second embodiment group of a wide-frequency wave-absorbing metamaterial in the disclosure.
Figure 12:
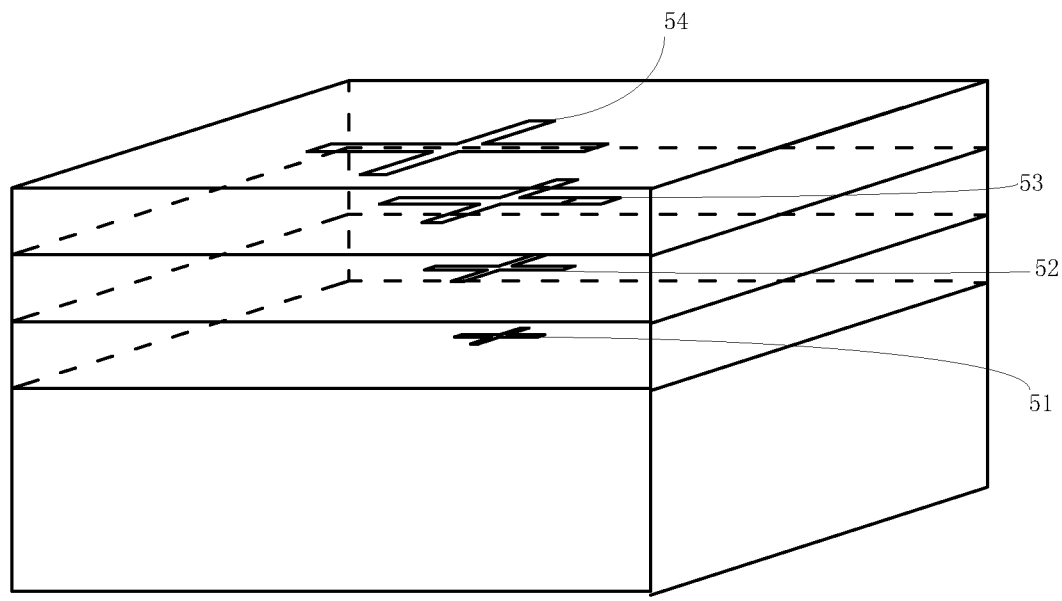
FIG. 12 is a schematic structural view of a basic unit forming a wide-frequency wave-absorbing metamaterial in still another embodiment in the second embodiment group of a wide-frequency wave-absorbing metamaterial in the disclosure.
Figure 13:
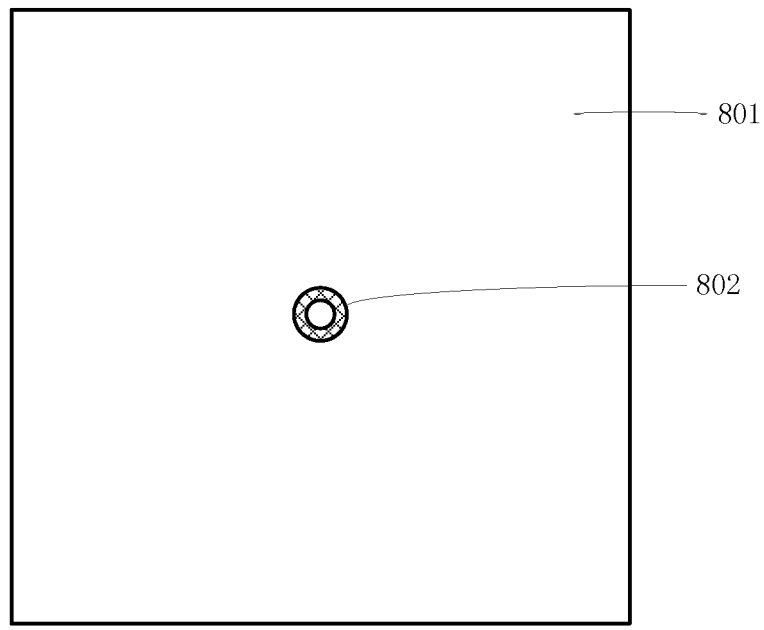
FIG. 13 is a schematic structural view of a microstructure at a first layer in still another embodiment in the second embodiment group of a wide-frequency wave-absorbing metamaterial in the disclosure.

FIG. 11 is a schematic structural view of a basic unit forming a wide-frequency wave-absorbing metamaterial in still another embodiment in the second embodiment group of a wide-frequency wave-absorbing metamaterial in the disclosure. As shown in FIG. 11, basic unit layers of a metamaterial include 401, 402, 403, and 404, and corresponding microstructures are respectively 41, 42, 43, and 44. Topology shapes of the microstructures may be crosses, H-shapes, plane snowflake shapes, circles, rings, circular rings, or topology shapes of other three-dimensional topology structures. In FIG. 11, crosses are used as an example for description. A size of the metamaterial microstructure 41 is less than a size of the metamaterial microstructure 42, the size of the metamaterial microstructure 42 is less than a size of the metamaterial microstructure 43, and the size of the metamaterial microstructure 43 is less than a size of the metamaterial microstructure 44. The basic unit layers of the metamaterial are arranged in a manner of the microstructure 41, the microstructure 42, the microstructure 43, and the microstructure 44 stacked successively from outer to inner; or as shown in FIG. 12, the basic unit layers of a metamaterial are arranged in a manner of a microstructure 54, a microstructure 53, a microstructure 52, and a microstructure 51 stacked successively from outer to inner.

As described in the foregoing, in an exemplary embodiment in the second embodiment group of a wide-frequency wave-absorbing metamaterial in the disclosure, the basic unit layers of a metamaterial are stacked in an outside-in manner with sizes of the microstructures of the corresponding basic unit layers ascending, as shown in FIG. 11.

In this exemplary embodiment, only four basic unit layers are enumerated. In an actual situation, the number of basic unit layers is not limited to four layers. In addition, successively stacking basic unit layers in an outer-to-inner manner according to sizes of microstructures at the basic unit layers may be in descending order or in ascending order, or first in descending order and then in ascending order. Only if a required wave-absorbing requirement can be met, combining may be performed according to the sizes of the microstructures, and details are not described herein.

Figure 14:
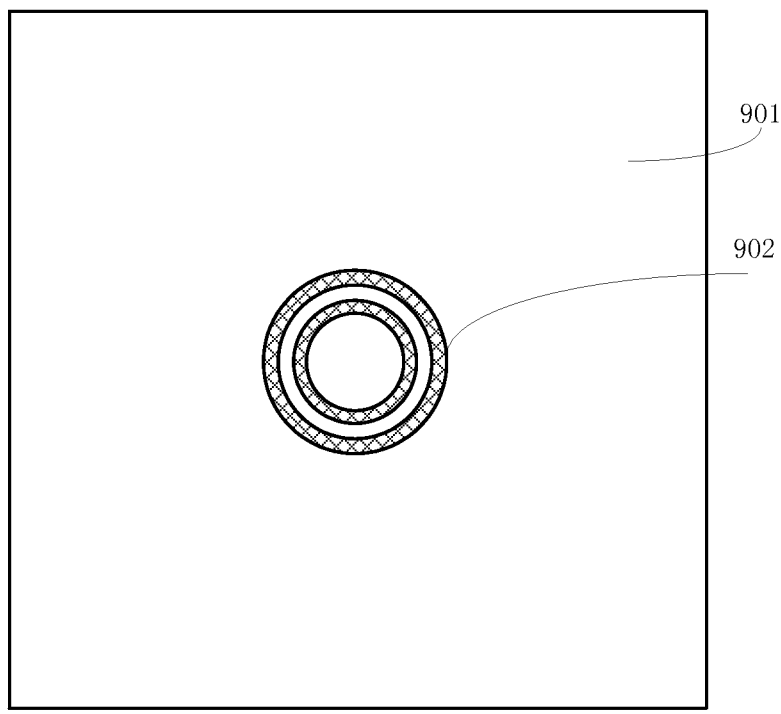
FIG. 14 is a schematic structural view of a microstructure at a second layer in still another embodiment in the second embodiment group of a wide-frequency wave-absorbing metamaterial in the disclosure.
Figure 15:
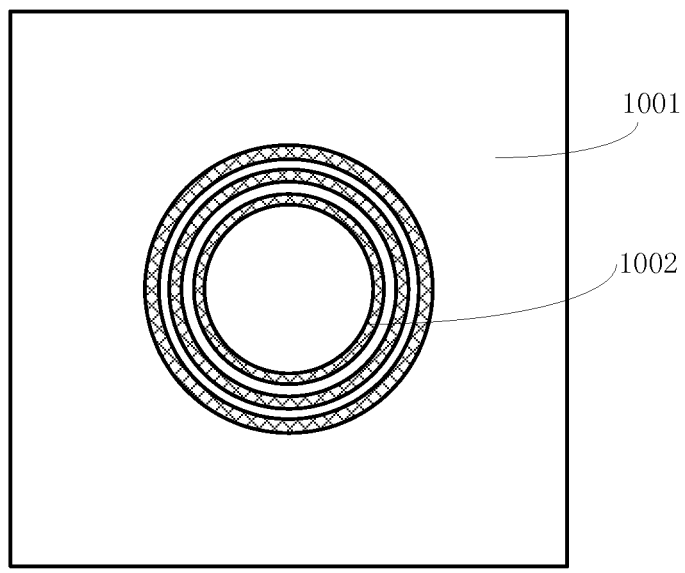
FIG. 15 is a schematic structural view of a microstructure at a third layer in still another embodiment in the second embodiment group of a wide-frequency wave-absorbing metamaterial in the disclosure.
Figure 16:
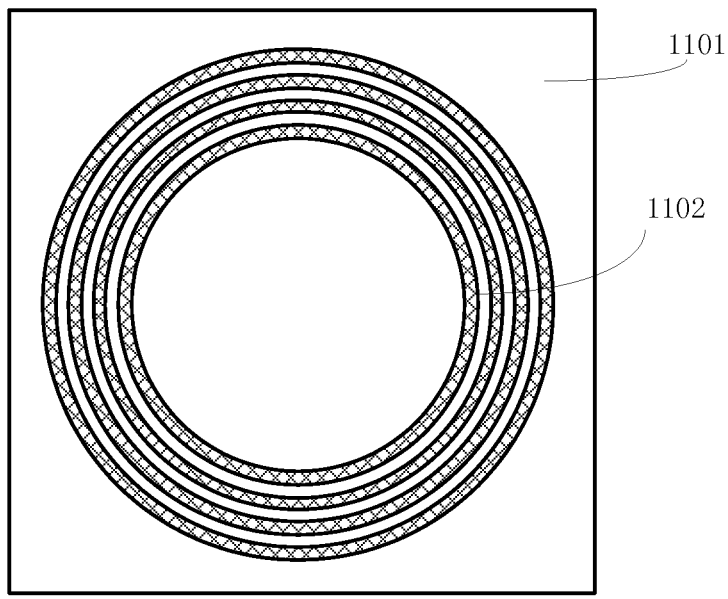
FIG. 16 is a schematic structural view of a microstructure at a fourth layer in still another embodiment in the second embodiment group of a wide-frequency wave-absorbing metamaterial in the disclosure.
Figure 17:
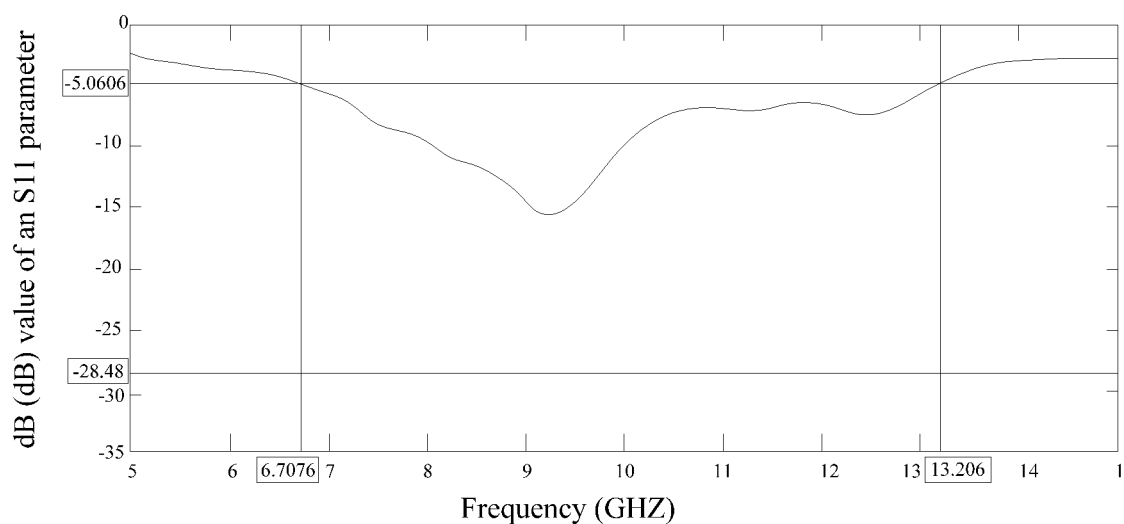
FIG. 17 is a schematic diagram of a simulation test of a metamaterial in still another embodiment in the second embodiment group of a wide-frequency wave-absorbing metamaterial in the disclosure.

In an exemplary embodiment in the second embodiment group of a wide-frequency wave-absorbing metamaterial in the disclosure, topology shapes of microstructures of basic unit layers are circular. The wide-frequency wave-absorbing metamaterial of the disclosure uses four basic unit layers that include microstructures different from each other. Microstructures of the layers are respectively shown in FIG. 13, FIG. 14, FIG. 15, and FIG. 16. First referring to FIG. 13, a first basic unit layer includes a first substrate 801 and a plurality of microstructures 802 periodically arranged on the first substrate 801. The microstructure 802 is a circular microstructure. A radius of the microstructure 802 is a first radius r0, and the circular microstructure 802 has a first line width. Referring to FIG. 14, a second basic unit layer includes a second substrate 901 and a second microstructure 902, where the second microstructure 902 includes a first circular microstructure whose radius is r1 and a second circular microstructure, of which a radius is r2, that is concentric with the first circular microstructure, wherein r2>r1>r0. A line width of the second circular microstructure is equal to a line width of the first circular microstructure. A first spacing is defined between the second circular microstructure and the first circular microstructure. Referring to FIG. 15, a third basic unit layer includes a third substrate 1001 and a third microstructure 1002, where the third microstructure 1002 includes a third circular microstructure whose radius is r3, a fourth circular microstructure whose radius is r4, and a fifth circular microstructure whose radius is r5. The third circular microstructure, the fourth circular microstructure, and the fifth circular microstructure are concentrically arranged with an equal spacing. The spacing is a first spacing; and r5>r4>r3>r2>r1>r0. Referring to FIG. 16, a fourth basic unit layer includes a fourth substrate 1101 and a fourth microstructure 1102, where the fourth microstructure 1102 includes a sixth circular microstructure whose radius is r6, a seventh circular microstructure whose radius is r7, an eighth circular microstructure whose radius is r8, and a ninth circular microstructure whose radius is r9. The sixth circular microstructure, the seventh circular microstructure, the eighth circular microstructure, and the ninth circular microstructure are concentrically arranged with an equal spacing. The spacing is the first spacing; and r9>r8>r7>r6>r5>r4>r3>r2>r1>r0. The four basic unit layers are stacked in an outer-to-inner manner to form a metamaterial, and a simulation test is performed on the metamaterial. As shown in FIG. 17, the horizontal axis indicates a frequency of an electromagnetic wave, and the vertical axis indicates a dB value of an s11 parameter. In a high frequency range of 5 to 15 GHz, wave-absorbing performance exists, and in a range of 6.71 to 13.21 GHz, the dB value of the S11 parameter is −5 dB. Results from the test indicate that compared with a metamaterial including a single basic unit layer, the metamaterial including a plurality of basic unit layers can significantly increase a wave-absorbing bandwidth.

Different from the prior art, at least two basic unit layers in the disclosure respectively absorb a predetermined frequency or a predetermined frequency band of an electromagnetic wave. The plurality of microstructures at the same basic unit layer are the same in topology shape and size. Microstructures at different basic unit layers are different in topology shape and/or size. The wave-absorbing metamaterial including a plurality of microstructure layers can significantly increase a wave-absorbing bandwidth based on a relatively good electromagnetic wave absorbing effect.

FIG. 18 is a schematic structural view of an embodiment of an electronic device of the second embodiment group of a wide-frequency wave-absorbing metamaterial in the disclosure. As shown in FIG. 18, an electronic device 1301 includes a casing, and the casing of an electronic device 1301 is provided with a wide-frequency wave-absorbing metamaterial 1302 arranged on. The metamaterial 1302 includes at least two basic unit layers. Each basic unit layer includes a substrate and a plurality of microstructures periodically arranged on the substrate. The basic unit layers respectively absorb a predetermined frequency or a predetermined frequency band of an electromagnetic wave. The microstructures at the same basic unit layer are the same in topology shape and size, and microstructures at different basic unit layers are different in topology shape and/or size.

According to an actual situation, the metamaterial of the electronic device includes two basic unit layers, three basic unit layers, . . . , or N basic unit layers, and includes at least two basic unit layers. Microstructures at the basic unit layers of the metamaterial are different, and the basic unit layers of the metamaterial respectively absorb a predetermined frequency or a predetermined frequency band of an electromagnetic wave.

The microstructures at different basic unit layers are different, so that functions of microstructures at different layers are also different. In addition, microstructures between layers affect each other, so that a wide-frequency wave-absorbing effect is achieved by synthesizing effects of the layers.

Topology shapes of microstructures at the basic unit layers are circular rings.

The at least two basic unit layers of the metamaterial are stacked in an outer layer-to-inner layer direction according to sizes of microstructures.

The at least two basic unit layers of the metamaterial are stacked in the outer layer-to-inner layer direction with the sizes of the microstructures at the basic unit layers ascending.

The at least two basic unit layers are stacked in an outer layer-to-inner layer direction according to periods of the microstructures at basic unit layers that are periodically arranged on the substrate.

The at least two basic unit layers are stacked in an outer layer-to-inner layer direction with periods of the microstructures at the basic unit layers that are periodically arranged on the substrate ascending.

Different from the prior art, the at least two basic unit layers in the disclosure respectively absorb a predetermined frequency or a predetermined frequency band of an electromagnetic wave. The microstructures at the same basic unit layer are the same in topology shape and size. Microstructures at different basic unit layers are different in topology shape and/or size. The wave-absorbing metamaterial including a plurality of microstructure layers can significantly increase a wave-absorbing bandwidth based on a relatively good electromagnetic wave absorbing effect.

FIG. 19 is a flowchart of an embodiment of a method for obtaining a wide-frequency wave-absorbing metamaterial in the second embodiment group of a wide-frequency wave-absorbing metamaterial in the disclosure. As shown in FIG. 19, the method includes:

Step S101: at least two basic unit layers are provided. Each basic unit layer includes a substrate and a plurality of microstructures periodically arranged on the substrate. The basic unit layers respectively absorb a predetermined frequency or a predetermined frequency band of an electromagnetic wave. The microstructures at the same basic unit layer are the same in topology shape and size, and microstructures at different basic unit layers are different in topology shape and/or size.

Step S102: the at least two basic unit layers are stacked to form a metamaterial.

The microstructures at different layers are different, so that functions of microstructures at different layers are also different. In addition, microstructures between layers affect each other, so that a wide-frequency wave-absorbing effect is achieved by synthesizing effects at the layers.

Different from the prior art, at least two basic unit layers in the second embodiment group of a wide-frequency wave-absorbing metamaterial in the disclosure respectively absorb a predetermined frequency or a predetermined frequency band of an electromagnetic wave. The microstructures at the same basic unit layer are the same in topology shape and size, and microstructures at different basic unit layers are different in topology shape and/or size. The wave-absorbing metamaterial including a plurality of microstructure layers can significantly increase a wave-absorbing bandwidth based on a relatively good electromagnetic wave absorbing effect.

Third Embodiment Group

The third embodiment group of the disclosure is described with reference to FIG. 20 to FIG. 21 in detail, where a wide-frequency wave-absorbing material is equivalent to a wide-frequency wave-absorbing metamaterial.

A wave-absorbing metamaterial is designed by using the foregoing metamaterial theory in the disclosure. A difference from FIG. 1 is that a basic unit of a wide-frequency wave-absorbing material in the third embodiment group of a wide-frequency wave-absorbing material in the disclosure includes a plurality of sheet layers stacked along an electromagnetic wave transmission direction. Each sheet layer includes a substrate and a metal coating. The metal coating is one of the foregoing microstructures. The metal coating coats an entire surface of the substrate. A thickness of the metal coating is exemplarily 0.01 mm to 0.02 mm, and a thickness of each sheet layer is exemplarily 0.2 mm. A material of the metal coating may be various types of conductive metals, such as copper, silver, and aluminum.

Figure 20:
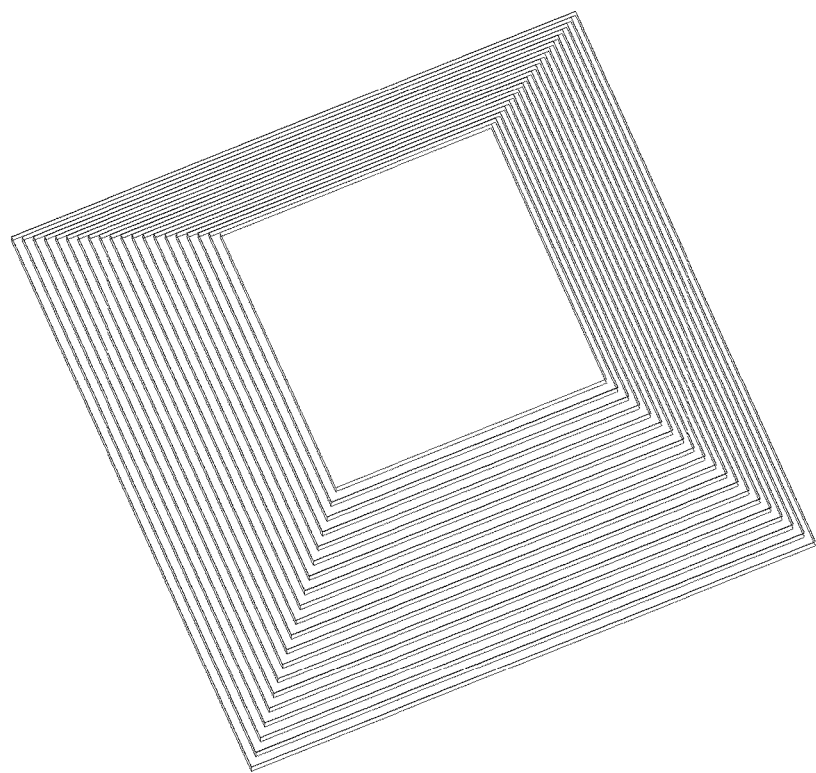
FIG. 20 is a schematic three-dimensional structural view of a basic unit in the third embodiment group of a wide-frequency wave-absorbing material in the disclosure.

Referring to FIG. 20, a schematic three-dimensional structural view of a basic unit in an embodiment of the third embodiment group of a wide-frequency wave-absorbing material in the disclosure is provided. It can be learned from FIG. 20 that sizes of sheet layers gradually increase along the electromagnetic wave transmission direction, and central axes of the sheet layers are coaxial with each other. In addition, along the electromagnetic wave transmission direction, the basic unit is divided into three parts, where substrates of the sheet layers in a first part have a first permittivity, substrates of the sheet layers in a second part have a second permittivity, and substrates of the sheet layers in a third part have a third permittivity. The first permittivity is less than the second permittivity and less than the third permittivity. Exemplarily, the first part of the basic unit includes four sheet layers, and a first permittivity of a substrate at each sheet layer is in the range of 2.6 to 2.8; the second part of the basic unit includes thirteen sheet layers, and a second permittivity of a substrate at each sheet layer is in the range of 3.5 to 4.0; and the third part of the basic unit includes three sheet layers, and a third permittivity of a substrate at each sheet layer is in the range of 8.5 to 9.0. The entire basic unit includes twenty sheet layers and a thickness of the basic unit is (0.2+0.018)*20=4.36 mm; therefore the thickness is extremely thin. Materials having the first permittivity, the second permittivity, and the third permittivity may be FR-4 materials, F4B materials, PS materials, and the like.

Exemplarily, a surface of each sheet layer with a metal coating is a square, and along the electromagnetic wave transmission direction, sizes of square surfaces of all sheet layers gradually increase in an equal difference manner. An equal difference proportion is: (side length of a surface of the largest square–side length of a surface of the smallest square)/(the number of sheet layers–1). Exemplarily, in the wide-frequency wave-absorbing material in the disclosure, a side length of a surface of the largest square is 10.4 mm, and a side length of a surface of the smallest square is 5 mm.

Sizes of all sheet layers of the basic unit in the third embodiment group of the wide-frequency wave-absorbing material in the disclosure gradually increase, and an effect of impedance matching is met. In addition, metal coatings at adjacent sheet layers form an equivalent capacitance, the metal coating itself forms an equivalent inductance, and the basic unit entirely forms a plurality of LC equivalent circuits. By properly configuring sizes of the metal coatings, effective permittivities of the substrates, and thicknesses of the substrates, values of all equivalent capacitances and equivalent inductances in the LC equivalent circuit are adjusted, so that resonance frequencies of the plurality of LC equivalent circuits are combined to achieve an effect of wide-frequency wave-absorbing. In addition, because a wave-absorbing frequency in the disclosure is determined by an LC resonance circuit formed by an equivalent capacitance and an equivalent inductance, when the wave-absorbing frequency needs to be changed, only the sizes of the metal coatings, the effective permittivities of the substrates, or the thicknesses of the substrates need to be changed.

When the basic unit of the wide-frequency wave-absorbing material in the third embodiment group of the disclosure uses 20 sheet layers, a first part includes four sheet layers, and a first permittivity of a substrate at each sheet layer is 2.65; a second part includes thirteen sheet layers, and a second permittivity of a substrate at each sheet layer is 3.73; a third part includes three sheet layers, and a third permittivity of a substrate at each sheet layer is 8.79; a thickness of each sheet layer is 0.2 mm; along an electromagnetic wave transmission direction, sizes of square surfaces of all sheet layers gradually increase in an equal difference manner; and when a size of the largest square surface is 10.4 mm, and the smallest square surface is 5 mm, a simulation result of an S11 parameter of the wide-frequency wave-absorbing material in the disclosure is shown in FIG. 3.

Figure 21:
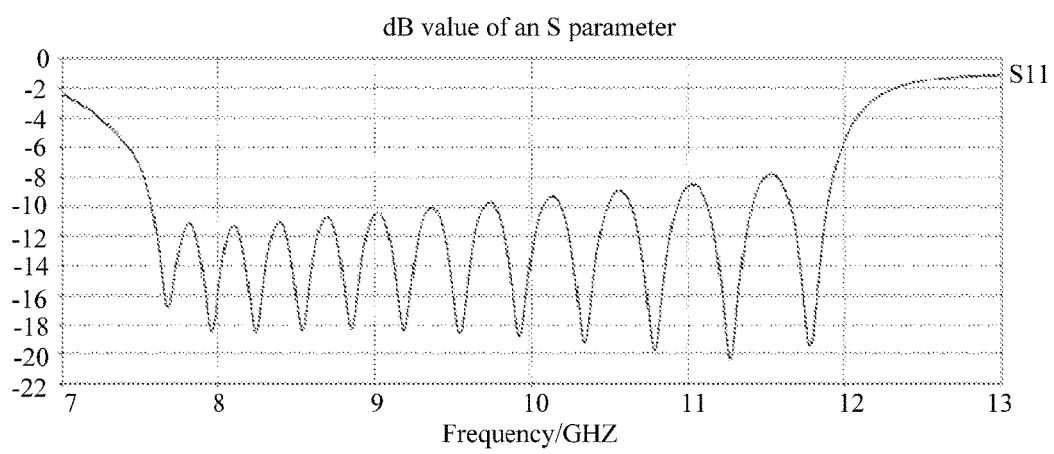
FIG. 21 is a diagram of a simulation result of an exemplary embodiment in the third embodiment group of a wide-frequency wave-absorbing material in the disclosure.

It may be learned from FIG. 21 that the wide-frequency wave-absorbing material in the third embodiment group of the wide-frequency wave-absorbing material in the disclosure has a relatively good wave-absorbing effect; in a bandwidth between 7.5 GHZ and 12 GHZ, an electromagnetic wave attenuation degree can reach more than 10 dB.

The foregoing embodiments are merely exemplary embodiments of the disclosure and are not used to limit the disclosure. For a person skilled in the art, the disclosure may have various modifications and changes. Any modification, equivalent replacement, and improvement made without departing from the spirit and principle of the disclosure shall fall within the protection scope of the disclosure.

What is claimed is:

1. A wide-frequency wave-absorbing metamaterial, wherein the metamaterial comprises at least two basic unit layers, each basic unit layer comprises a substrate and a plurality of microstructures periodically arranged on the substrate, the basic unit layers respectively absorb a predetermined frequency or a predetermined frequency band of an electromagnetic wave;
    wherein the topology and/or sizes of the microstructures at different layers are different;
    wherein the wide-frequency wave-absorbing metamaterial is virtually divided into a plurality of basic units, the basic unit comprises a plurality of layers of subunits, the subunit comprises the substrate and the microstructures attached to the substrate, topology of the microstructures on subunits at the layers are the same, and sizes of the microstructures of the subunits at the layers gradually increase along an electromagnetic wave transmission direction.

2. The wide-frequency wave-absorbing metamaterial according to claim 1, wherein the microstructure of the subunit at each layer comprises one or more first basic microstructures and one or more second basic microstructures, wherein the first basic microstructure is a complete circular ring-shaped microstructure, the second basic microstructure is a circular ring-shaped microstructure with four same, evenly spaced gaps defined along the circumference thereof, and the one or more first basic microstructures and the one or more second basic microstructures are concentrically arranged.

3. The wide-frequency wave-absorbing metamaterial according to claim 2, wherein the microstructure of the subunit at each layer comprises one first basic microstructure topology and one second basic microstructure topology, and a radius of the first basic microstructure topology is less than a radius of the second basic microstructure topology.

4. The wide-frequency wave-absorbing metamaterial according to claim 3, wherein the basic unit comprises nine layers of the subunits, the sizes of the microstructures of the subunit at the nine layers increase in a linear and equal proportion manner along a wave propagation direction, and a proportional number is 0.3-1.5.

5. The wide-frequency wave-absorbing metamaterial according to claim 2, wherein the microstructure of the subunit at each layer comprises two first basic microstructures whose radii are r1 and r2 and one second basic microstructure, a radius of the second basic microstructure is greater than r2, and r2 is greater than r1.

6. The wide-frequency wave-absorbing metamaterial according to claim 2, wherein the microstructure of the subunit at each layer comprises one first basic microstructure and two second basic microstructures whose radii are r1' and r2', r2' is greater than r1', and r1' is greater than a radius of the first basic microstructure.

7. The wide-frequency wave-absorbing metamaterial according to claim 1, wherein the plurality of microstructures at the same basic unit layer are the same in topology and size, and the microstructures at different basic unit layers are different in topology and/or size.

8. The wide-frequency wave-absorbing metamaterial according to claim 7, wherein the at least two basic unit layers of the metamaterial are stacked in an outer layer-to-inner layer manner according to sizes of microstructures at the basic unit layers.

9. The wide-frequency wave-absorbing metamaterial according to claim 8, wherein the at least two basic unit layers of the metamaterial are stacked along the outer layer-to-inner layer direction with the sizes of the microstructures at the corresponding basic unit layers ascending.

10. The wide-frequency wave-absorbing metamaterial according to claim 7, wherein the metamaterial comprises four basic unit layers, a first basic unit layer comprises a first substrate and a plurality of first microstructures periodically arranged on the first substrate, and the first microstructure is a circular microstructure; a second basic unit layer comprises a second substrate and a plurality of second microstructures periodically arranged on the second substrate, and the second microstructure comprises a first circular microstructure and a second circular microstructure, of which a radius is greater than a radius of the first circular microstructure, that is concentrically arranged with the first circular microstructure; a third basic unit layer comprises a third substrate and a plurality of third microstructures periodically arranged on the third substrate, the third microstructure comprises a third circular microstructure, a fourth circular microstructure, and a fifth circular microstructure, and the third circular microstructure, the fourth circular microstructure, and the fifth circular microstructure increase in radius successively and are concentrically arranged with an equal spacing; a fourth basic unit layer comprises a fourth substrate and a plurality of fourth microstructures periodically arranged on the fourth substrate, the fourth microstructure comprises a sixth circular microstructure, a seventh circular microstructure, an eighth circular microstructure, and a ninth circular microstructure, and the sixth circular microstructure, the seventh circular microstructure, the eighth circular microstructure, and the ninth circular microstructure increase in radius successively and are concentrically arranged with an equal spacing.

11. The wide-frequency wave-absorbing metamaterial according to claim 10, wherein at the second basic unit layer, a spacing between the second circular microstructure and the first circular microstructure is a first spacing; at the third basic unit layer, both a spacing between the third circular microstructure and the fourth circular microstructure and a spacing between the fourth circular microstructure and the fifth circular microstructure are the first spacing; at the fourth basic unit layer, a spacing between the sixth circular microstructure and the seventh circular microstructure, a spacing between the seventh circular microstructure and the eighth circular microstructure, and a spacing between the eighth circular microstructure and the ninth circular microstructure are the first spacing.

12. The wide-frequency wave-absorbing metamaterial according to claim 1, wherein the wide-frequency wave-absorbing material is virtually divided into a plurality of basic units, each basic unit comprises a plurality of sheet layers stacked along an electromagnetic wave transmission direction, each sheet layer comprises the substrate and the microstructure coated on a surface of the substrate, the microstructure is a metal coating, and sizes of the sheet layers gradually increase along the electromagnetic wave transmission direction, and central axes of the sheet layers coincide with each other.

13. The wide-frequency wave-absorbing metamaterial according to claim 12, wherein along the electromagnetic wave transmission direction, the basic unit is divided into three parts, wherein substrates at sheet layers of a first part have a first permittivity, substrates at sheet layers of a second part have a second permittivity, and substrates at sheet layers of a third part have a third permittivity; the first permittivity is less than the second permittivity and less than the third permittivity, and along the electromagnetic wave transmission direction, sizes of the sheet layers gradually increase in an equal difference manner.

14. The wide-frequency wave-absorbing metamaterial according to claim 13, wherein the first part of the basic unit comprises four sheet layers, and the first permittivity of a substrate at each sheet layer is 2.6 to 2.8; the second part of the basic unit comprises thirteen sheet layers, and the second permittivity of a substrate at each sheet layer is 3.5 to 4.0; and the third part of the basic unit comprises three sheet layers, and the third permittivity of a substrate at each sheet layer is 8.5 to 9.0.

15. The wide-frequency wave-absorbing metamaterial according to claim 12, wherein a thickness of each sheet layer is 0.2 mm, and a thickness of a metal coating is 0.01 to 0.02 mm.

16. The wide-frequency wave-absorbing metamaterial according to claim 12, wherein a surface of each sheet layer with a metal coating is a square, a side length of the largest square surface is 10.4 mm, and a side length of the smallest square surface is 5 mm.

17. An electronic device, comprising a casing, wherein the casing is provided with a wide-frequency wave-absorbing metamaterial arranged on, the metamaterial comprises at least two basic unit layers, each basic unit layer comprises a substrate and a plurality of microstructures periodically arranged on the substrate, the basic unit layers respectively absorb a predetermined frequency or a predetermined frequency band of an electromagnetic wave, the microstructures at the same basic unit layer are the same in topology and size, and microstructures at different basic unit layers are different in topology and/or size, wherein sizes of the microstructures of the subunits at the layers gradually increase along an electromagnetic wave transmission direction.

18. A method for making a wide-frequency wave-absorbing metamaterial, wherein the method comprises:

providing at least two basic unit layers, wherein each basic unit layer comprises a substrate and a plurality of microstructures periodically arranged on the substrate, the basic unit layers respectively absorb a predetermined frequency or a predetermined frequency band of an electromagnetic wave, the microstructures at the same basic unit layer are the same in topology and size, and microstructures at different basic unit layers are different in topology and/or size; and stacking the at least two basic unit layers to form a metamaterial;

wherein sizes of the microstructures of the subunits at the layers gradually increase along an electromagnetic wave transmission direction.

* * * * *